(12) United States Patent
Kitahata

(10) Patent No.: US 6,686,753 B1
(45) Date of Patent: Feb. 3, 2004

(54) PROBER AND APPARATUS FOR SEMICONDUCTOR CHIP ANALYSIS

(75) Inventor: Hideki Kitahata, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 190 days.

(21) Appl. No.: 09/641,954

(22) Filed: Aug. 21, 2000

(30) Foreign Application Priority Data

Sep. 13, 1999 (JP) .......................................... 11-258328

(51) Int. Cl.$^7$ ..................... G01R 1/073; G01R 31/28
(52) U.S. Cl. .................. 324/754; 324/752; 324/765; 324/762
(58) Field of Search ................. 324/750, 752, 324/754, 765, 158.1, 762, 758

(56) References Cited

U.S. PATENT DOCUMENTS

| | | | | |
|---|---|---|---|---|
| 4,312,117 A | * | 1/1982 | Robillard et al. | 216/14 |
| 4,746,857 A | * | 5/1988 | Sakai et al. | 324/765 |
| 5,583,445 A | * | 12/1996 | Mullen | 324/753 |
| 5,838,159 A | * | 11/1998 | Johnson | 324/750 |
| 6,335,629 B1 | * | 1/2002 | Lee et al. | 324/752 |

FOREIGN PATENT DOCUMENTS

| | | |
|---|---|---|
| JP | 3-169038 | 7/1991 |
| JP | 3-199976 | 8/1991 |
| JP | 3-217037 | 9/1991 |
| JP | 4-330753 | 11/1992 |
| JP | 3012541 | 4/1995 |
| JP | 7-122600 | 5/1995 |
| JP | 9-236640 | 9/1997 |
| JP | 10-223707 | 8/1998 |
| JP | 10-332764 | 12/1998 |

* cited by examiner

*Primary Examiner*—Ernest Karlsen
(74) *Attorney, Agent, or Firm*—Young & Thompson

(57) ABSTRACT

In evaluation and analysis of a semiconductor device using optical detection for a semiconductor chip, both front side analysis and back side analysis are enabled at low cost and a short TAT. A prober for conducting the analysis includes a board having a size equal to the size of a semiconductor wafer, a quartz plate provided in an opening of the board, and a manipulator on the board. The semiconductor chip is pushed and fixed onto a quartz plate using the pressure from a probe. During the front side analysis, the prober for conducting the analysis is mounted on a wafer stage and analysis is performed using an optical device while an electrical input is made through the probe. During the back side analysis, a removable plate is attached and the prober for conducting the analysis is turned upside down and mounted on the wafer stage. The analysis is again performed using the optical device while electrical input is made through the probe.

16 Claims, 8 Drawing Sheets

PROBER AND APPARATUS FOR SEMICONDUCTOR CHIP ANALYSIS

BACKGROUND OF THE INVENTION

1. Field of the Invention

The present invention relates to an analysis prober and an analysis apparatus for analyzing a semiconductor chip, and more particularly to a prober for semiconductor chip analysis and an analysis apparatus for optically evaluating a semiconductor chip.

2. Description of the Related Art

Methods of performing evaluation and analysis of semiconductor devices include an EMS (Emission Microscope) method in which, while a voltage is applied to a semiconductor device, an optical detector observes light emitted from a faulty point or the like, and an OBIC (Optical Beam Induced Current) method in which a surface of a semiconductor chip is scanned with laser light to detect a change in current produced at a faulty point or the like. FIG. 1 is a sectional view showing a prior art of a wafer analysis apparatus which performs evaluation and analysis of such a kind for a semiconductor device in a wafer state.

Optical device 11 for analysis such as a CCD (Charge Coupled Device) camera or laser is disposed at an upper position, and semiconductor wafer 13 is placed with its front facing upward on wafer stage 12. Wafer stage 12 is moved for positional adjustment such that a chip to be analyzed is located directly below optical device 11 for analysis. Semiconductor wafer 13 is vacuum absorbed by and fixed to wafer stage 12 which has numerous small holes therein for allowing vacuum absorption. Then, while the surface of the wafer is viewed from above using microscope 14 for probe position check, the position of probe 6 (metallic probe) is set through the following operations to perform probing. Specifically, probe 6 is moved vertically by manipulating adjustment handle 24a of manipulator 5 fixed to platen 15, and is moved along the surface of the semiconductor wafer by manipulating adjustment handle 24b.

After such probing, electrical input is provided to an integrated circuit within the semiconductor chip through probe 6, and optical device 11 for analysis is used from above to detect light produced from a faulty point or the like or to scan the surface of the semiconductor chip with a laser beam. Simultaneously with the observation of the light, optical device 11 for analysis observes the image of the surface of the chip to be analyzed to identify the point where the light is produced or the point where a current change is produced, thereby performing evaluation and analysis of the chip to be analyzed.

As described above, in typical analysis with probing, all the optical detection, scanning and probing are performed on the front of the chip.

It should be noted that microscope 14 for probe position check and optical device 11 for analysis may be installed as one unit having both functions.

In recent years, however, wiring is increasingly multilayered with a larger scale semiconductor integrated circuit, which makes it difficult to identify a faulty point from the front of a chip which is covered with metallic wiring. As a technique to analyze a fault in such an integrated circuit, a technique of detecting a defective point from the back of a chip (back side analysis technique) is conducted with the EMS method or OBIC method by utilizing infrared light with high transmittance for a semiconductor.

The back side analysis technique which can utilize only the light in the infrared range, however, has problems such as lower detection sensitivity than that of the analysis from the front of a chip which can utilize a wider wavelength range, and in some cases, the front side analysis technique may be more effective. From the need for addressing such a condition, a number of commercially available apparatuses are capable of evaluation and analysis from both front and back of a chip.

Such analysis apparatuses require that electrical input is supplied to the front of a semiconductor chip having an integrated circuit formed therein, and the semiconductor chip is held in such a manner that optical observation is allowed from the back of the chip at back side analysis, or from the front of the chip at front side analysis. To this end, such analysis apparatuses generally employ an approach in which an expensive optical device for analysis responsible for the function of detecting a defective point is set to one system, and the semiconductor chip is held with its front and back reversed depending on whether the front side analysis or back side analysis is performed.

For example, a semiconductor chip is mounted in a mold package or the like which is processed with relative ease, and the chip is opened at the back for the back side analysis technique while the chip is opened at the front for the front technique, thereby allowing both analysis techniques to be performed with relative ease. Specifically, even when the whole package is held with its front and back reversed, input/output terminals of the integrated circuit are drawn to lead terminals around the package to enable electrical input through the lead terminals. In this case, however, there is a problem of a longer analysis TAT (Turn Around Time) due to the time taken for the mounting into and opening of the package.

FIG. 2 is a sectional view of a mold package for explaining the back side analysis technique. Semiconductor chip 4 is mounted on island 16 and wire bonding is performed to connect input/output terminals of an integrated circuit to lead 17. Semiconductor chip 4 and bonding wire 18 are held with mold resin 19. Then, mold resin 19 and island 16 on the back of the chip are removed to provide opening 20 for exposing the back of the chip. In an analysis apparatus having a package accommodating mechanism, electrical input/output is made from lead 17 and back side analysis is performed through back opening 20.

On the other hand, when analysis is performed on a chip which is not mounted in a package or in a wafer state, probing is required for electrical input. In this case, if the chip is turned upside down, the probing is performed from the opposite direction, which change is not easy.

FIG. 3 is a sectional view of an analysis apparatus which has optical device 11 disposed at an upper position and is configured to allow probing of a semiconductor wafer from both above and below, but in this case probing is performed from below for back side analysis. Semiconductor wafer 13 is placed such that a chip to be analyzed is disposed directly below opening 22 for analysis formed at the center of removable wafer stage 21, and the wafer is fixed with vacuum absorption using numerous holes formed in a contact surface of removable wafer stage 21. Thereafter, removable wafer stage 21 is set on a wafer stage mounting section (not shown) provided in the analysis apparatus such that the back of the chip faces upward. While the surface of the wafer is viewed from below with CCD camera 23 for probe position check, probing is performed by manipulating adjustment handles 24a, 24b of manipulator 5 provided at platen 15 similarly to the aforementioned prior art. Electrical input is supplied to an integrated circuit within the semiconductor chip through probe 6, and the back side analysis is performed from the aforementioned opening 22 using optical device 11 for analysis.

When front side analysis is performed using the analysis apparatus, manipulator 5 is mounted to platen 15 on the opposite side and removable wafer stage 21 and CCD camera 23 are removed. A wafer stage for front side analysis is disposed in a lower position and a semiconductor wafer is fixed thereon, and then probing and the front side analysis are performed from above with optical device 11 for analysis which is integrated with a microscope.

A first problem in the aforementioned cases is a long analysis TAT when a semiconductor chip is mounted in a package for analysis. In the back side analysis, the analysis TAT is particularly longer. That is because it is necessary that the semiconductor chip is mounted in the package for allowing electrical input to the semiconductor integrated circuit and then the package is opened at a desired position for failure analysis.

In the front side analysis, analysis can be performed with simple mounting by fixing the back of a chip onto an island through a solder material and performing bonding. The back side analysis, however, is difficult to perform with such simple mounting due to the difficulty of bonding with the back of a chip opened. In the back side analysis, it is necessary that the back of a chip is fixed onto an island through a solder material and wire bonding is performed, and then the semiconductor chip, the bonding wires and leads are held with a mold resin or the like, and further, the mold resin, the island and the solder material on the back of the chip are removed, and the back of the semiconductor chip is subjected to mirror polishing.

A second problem is high cost of analysis when analysis is enabled from both front and back of a semiconductor chip with probing performed on the chip. That is because an analysis apparatus for allowing both front side analysis and back side analysis is expensive.

When an optical device for analysis responsible for detecting a defective point is set to one system and a semiconductor chip is held with its front and back reversed depending on whether the front side analysis or back side analysis is performed, the probing is also performed from the opposite direction, thereby requiring an expensive prober provided with a specialized probing mechanism. In contrast, when an optical device for analysis responsible for detecting a defective point is increased to two systems, the front side analysis and back side analysis are allowed and the direction of probing is set in one direction. However, the need still exists for simultaneously exposing the back of a chip for which optical detection is performed and the front of the chip for which probing is performed in order to perform the back side analysis. Also, the addition of the expensive optical device for analysis renders the cost of the analysis apparatus higher than that when a specialized probing mechanism is added thereto.

A third problem is the difficulty in analyzing a semiconductor chip of specific shape due to restrictions on the shape of the semiconductor chip which is fixed to a stage using vacuum absorption when the back of the semiconductor chip faces upward and probing is performed from below. That is because it is impossible to ensure a region in the perimeter of the chip for holding the chip at the vacuum absorption if the chip has a dimension smaller than an opening in the stage for the back side analysis. If the opening in the stage is too large, a small chip cannot be fixed. If the opening in the stage is too small, the entire chip is difficult to observe.

When a number of stages having openings with different sizes are provided, semiconductor chips of various shapes and dimensions can be held. However, the provision of many stages each with a vacuum absorption mechanism increases the cost of analysis, and additionally, the production of a stage for each analysis increases the analysis TAT. A further problem is the inability to detect a defect in a holding region of a chip for the vacuum absorption since the region is covered with the stage and cannot be subjected to the back side analysis. Therefore, it is difficult to analysis the entire semiconductor chip which is cut into pellet shape in the fixing with the vacuum absorption.

A fourth problem is a drawback in workability when the back of a semiconductor chip faces upward and probing is performed from below. That is because the surface of the semiconductor chip must be observed within a limited field of view provided by a CCD camera or the like.

In normal setting of a wafer prober when analysis is performed with the front of a semiconductor chip facing upward, the position of a chip to be analyzed within a wafer is visually checked, and then the chip is moved below a microscope. While the positions of a probe and a pad (electrical terminal portion) on the semiconductor chip are checked with the microscope, a manipulator is operated to perform probing. At this point, when the observed image with the microscope is an erect image, workability is good since the direction of the probe observed in the field of view of the microscope matches the direction of the operated manipulator. However, when the front of the semiconductor chip is observed with the back of the semiconductor chip facing upward, the workability of the probing is deteriorated since an observer must make a visual check looking from below upward.

To avoid this, a monitor image from the CCD camera or the like is often utilized as in the aforementioned prior art. The limited field of view of the CCD camera or the like, however, deteriorates the workability when a particular chip to be analyzed is selected on a wafer on which many chips with the same pattern are aligned. In addition, when an observer operates a manipulator while viewing the monitor image, some skills are required to acquire intuitive matching of the direction of the probe observed on a screen and the direction of the manipulator being operated. For improving the workability, it is possible to perform probing operations on a monitor of a computer using an remotely operable electric manipulator and an electric stage, but a problem exists that analysis equipment becomes expensive accordingly and the analysis cost is increased.

Therefore, the task of the present invention is to solve the aforementioned problems in the prior art, and it is an object thereof to perform probing on a semiconductor chip as well as to allow analysis from both front of the chip and back of the chip, using an analysis apparatus having a wafer stage for a wafer prober which fixes a wafer with its front facing upward, thereby enabling failure analysis at low cost and a short TAT.

SUMMARY OF THE INVENTION

To achieve the aforementioned object, according to the present invention, a prober for analyzing a semiconductor chip is provided, the prober comprising a chip stage on which a semiconductor chip is mounted and a plurality of probes in contact with the semiconductor chip from the front of the semiconductor chip, wherein at least part of the chip stage in contact with the semiconductor chip includes an infrared ray transmitting plate, and the semiconductor chip is pushed onto the chip stage with pressure at probing from the probe and fixed onto the chip stage.

Preferably, the probe is movable vertically and horizontally with a manipulator supported on the chip stage. In addition, an anti-slip piece is preferably formed on the stage for supporting at least one side of the semiconductor chip. Preferably, a removable covering plate can be provided to cover over the chip stage while probing is performed on the semiconductor chip.

To achieve the aforementioned object, according to the present invention, an apparatus for analyzing a semiconductor chip is provided, in which the prober for analyzing a semiconductor chip can be mounted on a prober stage, while probing is performed on a semiconductor chip, with the chip stage or the surface opposite to the surface of the covering plate facing the semiconductor chip being contact with the prober stage, and the semiconductor chip can be analyzed using an optical device provided above the prober stage.

Preferably, the prober stage holds the prober for analyzing a semiconductor chip with vacuum absorption of the chip stage or the covering plate. An optical device is provided above the prober stage, and at least one of the prober stage and the optical device is movable in the horizontal direction.

Since the prober for analysis of the present invention performs probing on a semiconductor chip cut from a semiconductor wafer, it can be reduced in size. In addition, the provision of an anti-slip piece allows the semiconductor chip to be fixed with the pressure from probing. Thus, a mechanism for vacuum absorption is not required and chips of more various shapes can be fixed, and the small and simple structure can reduce the manufacturing cost. Since the reduced size enables a reduction in weight, handling of the prober is facilitated, such as carrying while probing is performed, turning it upside down or the like. In other words, in performing failure analysis, only probing can produce effects similar to those obtained by mounting in a package, thereby making it possible to reduce the time taken for mounting in a package to allow a shorter analysis TAT.

It should be noted also that in the prober for analysis of the present invention, since the bottom surface of the semiconductor chip is pushed against and fixed to a plate which can pass infrared light, the back side analysis can be performed through the infrared ray transmitting plate. Thus, the opening of the chip at the back is eliminated to further reduce the analysis TAT as compared with the back side analysis performed when a chip is mounted in a package.

On the other hand, since no holding region for vacuum absorption is required in the perimeter of a chip in contrast to the probing performed on a semiconductor chip fixed using the vacuum absorption, it is possible to perform analysis of the entire back of semiconductor chips of more various shapes.

In addition, the prober for analysis of the present invention has a mechanism for mounting a removable plate. Thus, even when the prober is turned upside down, it can be fixed with vacuum absorption onto a wafer stage for a wafer prober used in the front side analysis technique in which a wafer is fixed with the front facing upward. Therefore, since both front side analysis and back side analysis are allowed in an analysis apparatus having a wafer stage for a wafer prober used in a typical front side analysis technique, no expensive analysis apparatus is required, thereby allowing an increase in cost of analysis to be suppressed.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Next, preferred embodiments of the present invention are described in detail with reference to the drawings.

First Embodiment (Description of Constitution)

Figure 4:
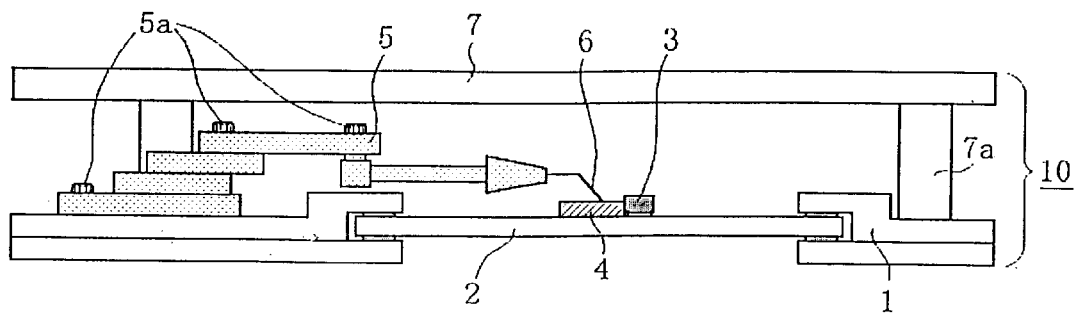
FIG. 4 is a vertical sectional view of a prober for analysis for explaining a first embodiment of the present invention.
Figure 5:
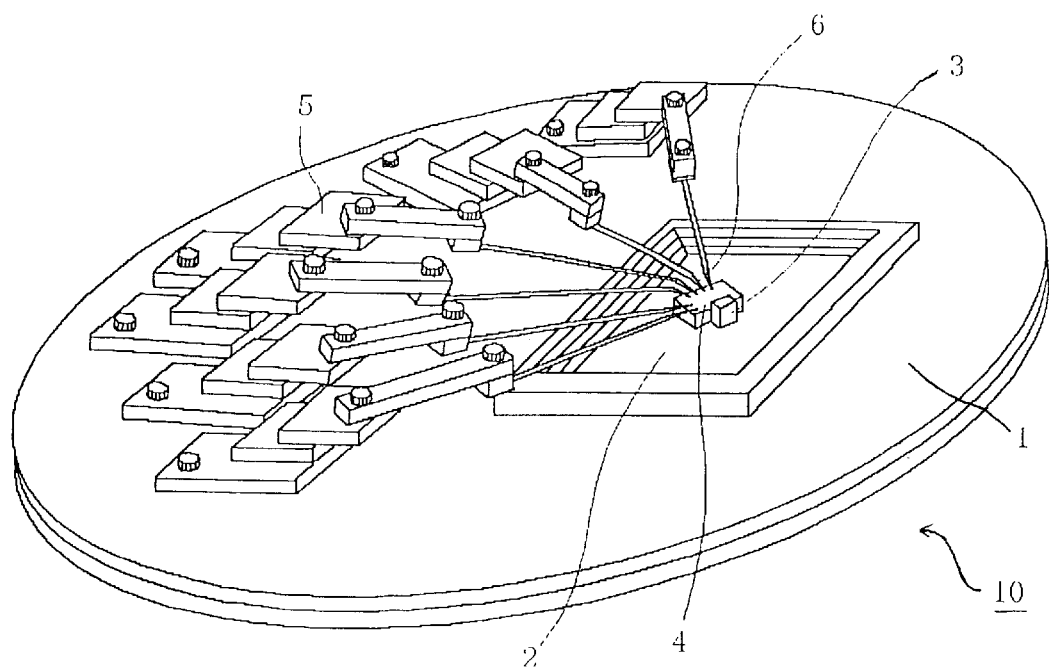
FIG. 5 is a perspective view of the prober shown in FIG. 4.

FIG. 4 is a vertical sectional view of a prober for analysis for explaining a first embodiment in the present invention, and FIG. 5 is a perspective view of the prober.

Prober 10 for analyzing a semiconductor chip of the present invention includes board 1 which has a dimension approximately corresponding to a semiconductor wafer and which forms the general frame. Part or all of board 1 is made of a material which can pass infrared light such as quartz plate 2. A plurality of manipulator 5 are disposed for performing probing on board 1 serving as a basis. Anti-slip piece 3 of convex shape is disposed for supporting at least one side of semiconductor chip 4 within a region on board 1 through which infrared light can pass. Anti-slip piece 3 is formed from materials which are easily processed such as plastic or glass. In addition, removable plate 7 for covering board 1 from above and post 7a for supporting removable plate 7 are provided on board 1 (removable plate 7 and post 7a are not shown in FIG. 5). Removable plate 7 is attached to board 1 with screws or the like as required (i.e. at back side analysis). While post 7a is fixed to removable plate 7 in this embodiment, the post may be fixed to the board and the removable plate may be attached to and detached from post 7a.

FIG. 4 shows board 1 configured to have quartz plate 2 inserted between two metallic plates. This structure is provided for maintaining mechanical strength by forming the portions where manipulators 5 or post 7a are disposed from metal.

When board 1 is fixed onto a wafer stage for a wafer prober with vacuum absorption at front side analysis, the bottom surface of board 1 is polished flatly to the extent that it can be closely contact with the wafer stage, and the metallic plates and quartz plate 2 may be closely contact with one another through a rubber O ring or the like.

For performing back side analysis, at least the portion of board 1 contact with and fixed to the back of semiconductor chip 4 must be made of a material which can pass infrared light. Removable plate 7 is provided for fixing the prober for analysis of the present invention with vacuum absorption when the prober is disposed for back side analysis on a wafer stage intended for a typical wafer prober used in the front technique. Thus, the top surface of removable plate 7 is desirably polished flatly to the extent that it can be disposed on the wafer stage with close contact.

Figure 1:
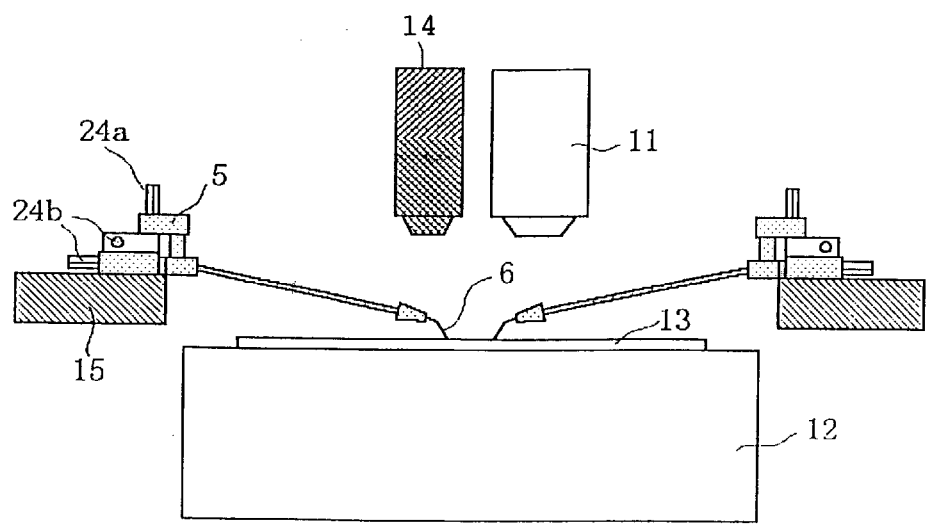
FIG. 1 is a vertical sectional view of a wafer prober for explaining a conventional front side analysis technique.
Figure 2:
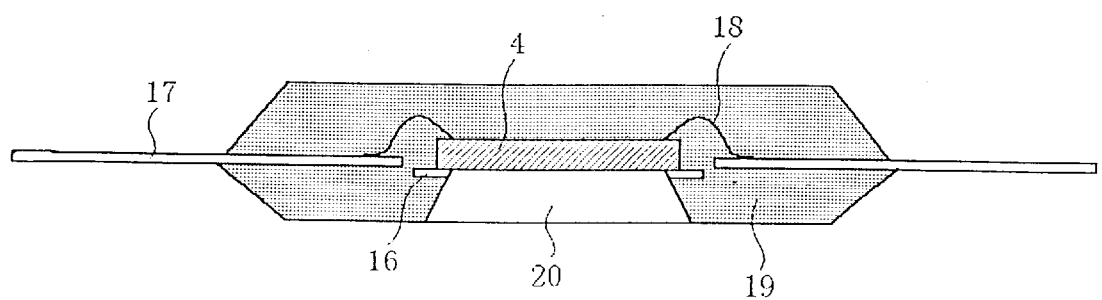
FIG. 2 is a vertical sectional view for explaining a conventional back side analysis technique.
Figure 3:
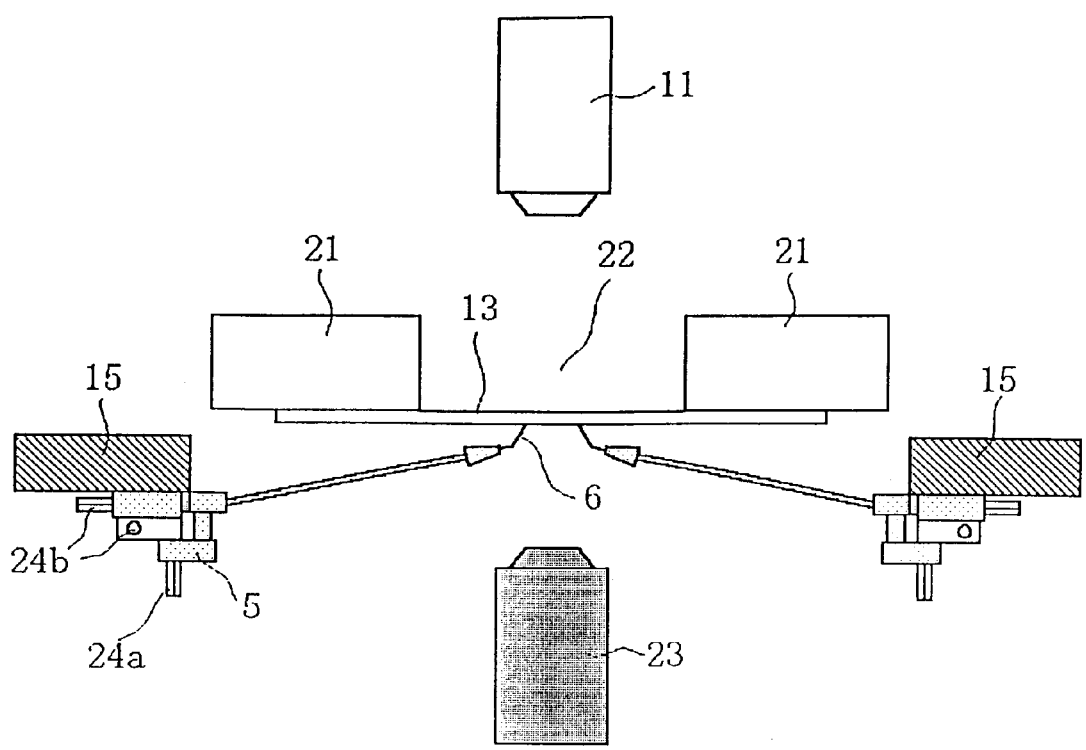
FIG. 3 is a vertical sectional view of a wafer prober for explaining a conventional back side analysis technique.

Manipulator 5 mounted has as small a dimensional shape as possible for providing a small prober to allow an increased number of probing operations. For example, since a manipulator of the type provided with adjustment handles 24a, 24b for turning screws for positional adjustment of a probe as shown in FIG. 3 has a larger dimension, a manipulator of the type provided with adjustment screws 5a to be turned by a tool such as a screwdriver as shown in FIG. 4, or a manipulator of the type with a removable handle portion is preferable.

Especially when the prober for analysis of the present invention is disposed for back side analysis on a wafer stage intended for a typical wafer prober, a problem is implied that the position for fixing a semiconductor chip is elevated as compared with the typical position of a semiconductor chip. To allow the back side analysis on a wafer stage intended for a typical wafer prober in such a case, the position for fixing a semiconductor chip must be avoided from being elevated beyond a movable range of an optical device for analysis. Such a requirement can be met by using manipulator 5 of the type with a small height so that post 7a is suppressed to a small height as shown in FIG. 4.

The prober for analysis of the present invention configured as described above can be fixed with vacuum absorption to a wafer stage of an analysis apparatus having a typical wafer prober at front side analysis or back side analysis. Some typical wafer analysis apparatuses have a highly accurate stage moving capability so that coordinates are set on a wafer stage and utilized for identifying a defective point within a semiconductor chip. However, no matter how good the moving accuracy of the wafer stage is, inadequate fixing of the semiconductor chip onto the stage causes slight displacements from the fixing position due to vibration at the stage moving or the like, making it impossible to accurately identify the coordinates of a defective point. Therefore, fixing with vacuum absorption is essential when the coordinates on the wafer stage are utilized for identifying a defective point from analysis.

(Description of Operation)

Figure 6A:
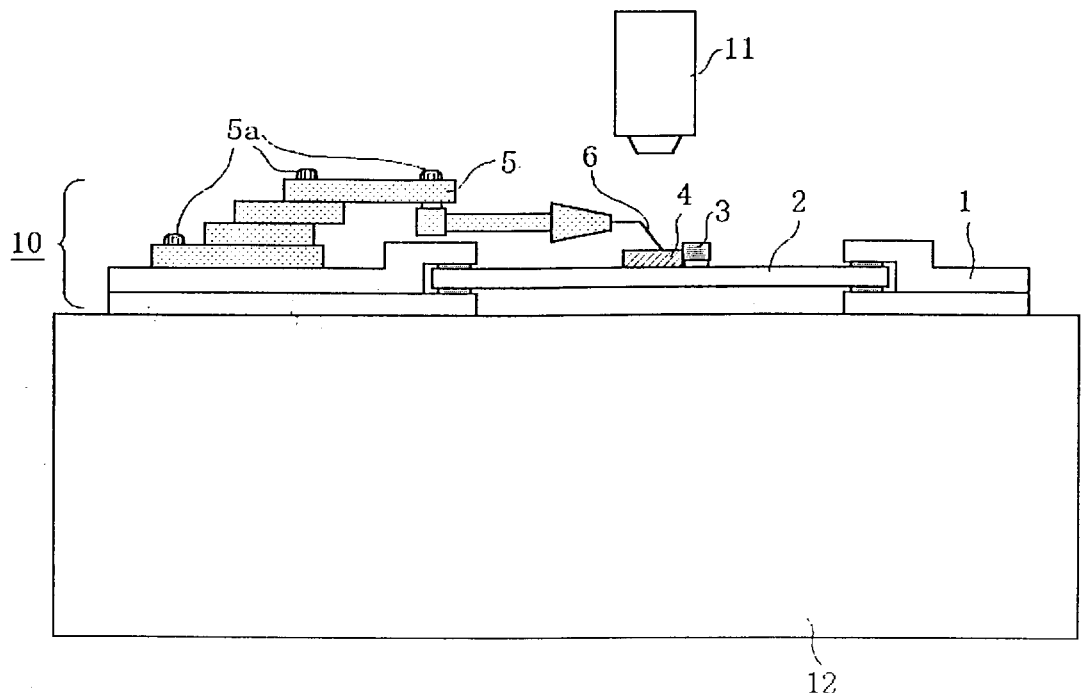
FIG. 6A is a vertical sectional view for explaining setting of front side analysis according to the first embodiment.

Prior to the implementation of evaluation and analysis, first, the bottom surface and side surface of semiconductor chip 4 to be analyzed are brought into contact with board 1 and anti-slip piece 3, respectively. Manipulator 5 disposed opposite to anti-slip piece 3 with respect to semiconductor chip 4 is used to bring probe 6 into contact with a pad on semiconductor chip 4 for providing a probing-ready state. Then, as shown in FIG. 6A, the prober is fixed onto wafer stage 12 of a typical wafer analysis apparatus with vacuum absorption. A microscope, not shown, provided as standard equipment for the wafer analysis apparatus is used to adjust adjustment screws 5a of manipulator 5 for performing probing. Thus, the force from probe 6 pushes semiconductor chip 4 in its bottom direction and side direction, and fixes semiconductor chip 4.

At this point, a probing mechanism provided originally for the analysis apparatus is removed. Alternatively, it is moved to a position where it causes no interference with prober 10 for analyzing a semiconductor chip.

Then, when evaluation and analysis are performed in the front side analysis technique, electric input is supplied through probe 6 with this state maintained, and evaluation and analysis of semiconductor chip 4 are performed from the front of semiconductor chip 4 using optical device 11.

Figure 6B:
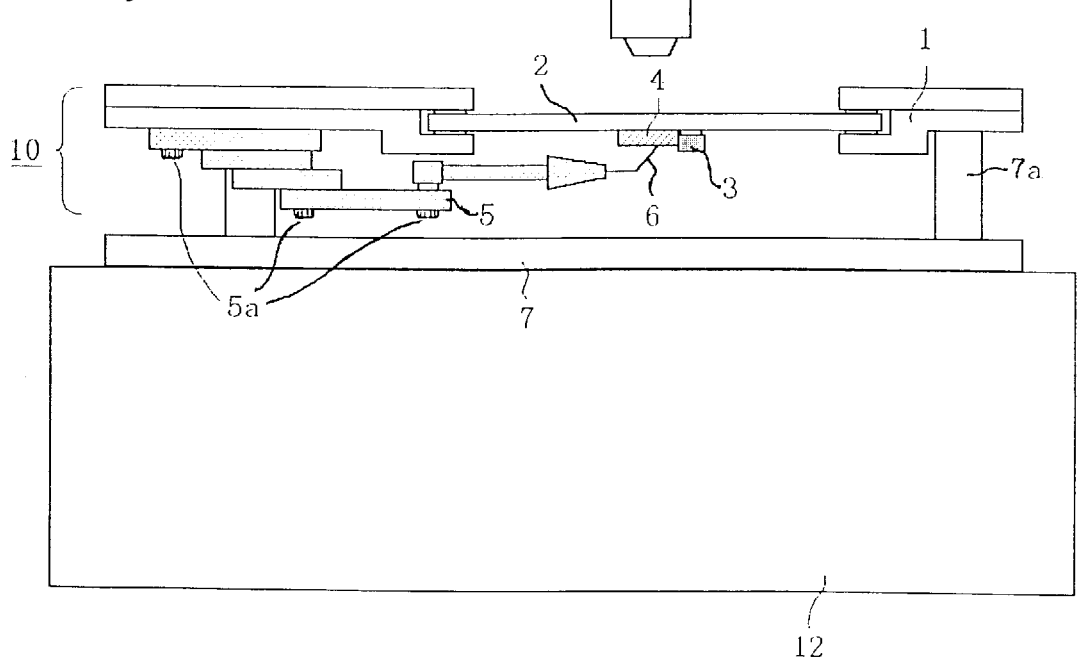
FIG. 6B is a vertical sectional view for explaining setting of back side analysis according to the first embodiment.

When evaluation and analysis are performed in the back side analysis technique, prober 10 for analysis is removed from wafer stage 12 and then removable plate 7 is mounted over the board. The entire prober 10 for analysis is turned upside down as shown in FIG. 6B, and removable plate 7 faces downward, placed on wafer stage 12, and fixed thereto with vacuum absorption. After setting to such a state, electrical input is supplied through probe 6 of the prober for analysis, and a defective point is detected from the back of semiconductor chip 4 through quartz plate 2. The positional adjustment of the prober for analysis, if necessary, is performed by moving wafer stage 12.

Figure 7:
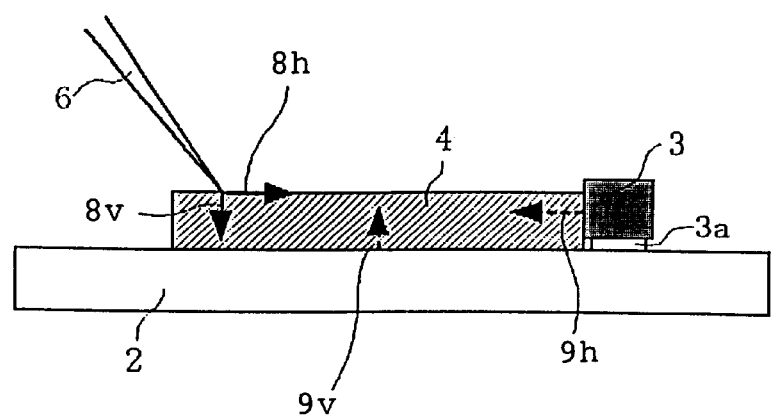
FIG. 7 is a vertical sectional view showing forces exerted on a semiconductor chip of the first embodiment.

Next, description is made for the relationship of forces exerted on a semiconductor chip at probing with reference to FIG. 7. Manipulator 5 and anti-slip piece 3 are previously disposed at positions where the pressure at the probing on semiconductor chip 4 causes semiconductor chip 4 to be pushed against anti-slip piece 3.

The probing on semiconductor chip 4 is performed by pushing the end of probe 6 inclined with respect to the normal to the chip surface against the pad on semiconductor chip 4. The probe pressure exerted on semiconductor chip 4 from probe 6 at this point consists of probe pressure 8v which tends to push downward and probe pressure 8h which tends to slide in the horizontal direction, from the elasticity of probe 6, as shown in FIG. 7. Of the pressures, the former balances repulsion 9v received from quartz plate 2 and the latter balances repulsion 9h received from anti-slip piece 3, thereby fixing semiconductor chip 4. Anti-slip piece 3 is fixed onto quartz plate 2 with adhesive 3a, but it may be fixed with an easily removable double-faced tape or the like for accommodating chips of various shapes.

It should be noted that gravity applied to semiconductor chip 4 is negligible since it is smaller than the probe pressure.

Figure 8:
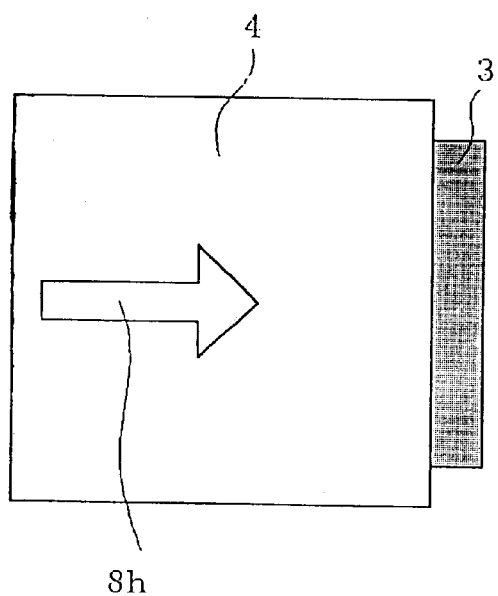
FIG. 8 is a plan view (1) for explaining how a semiconductor chip of the present invention is fixed.
Figure 9:
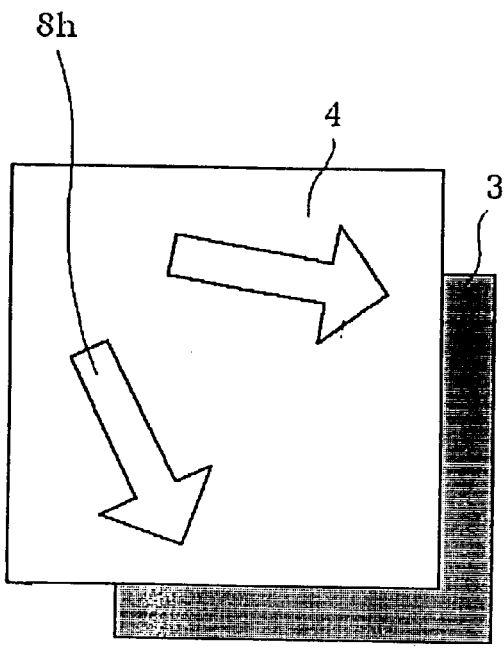
FIG. 9 is a plan view (2) for explaining how the semiconductor chip of the present invention is fixed.
Figure 10:
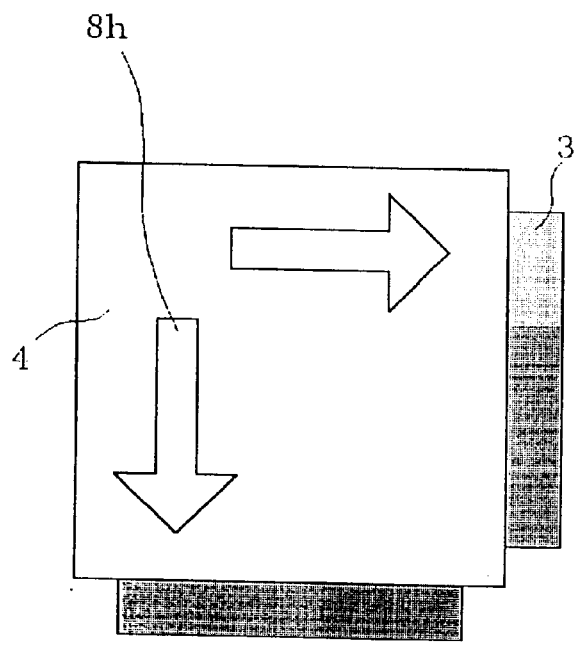
FIG. 10 is a plan view (3) for explaining how the semiconductor chip of the present invention is fixed.

Subsequently, description is made for the shape of the anti-slip piece required for fixing the semiconductor chip. FIG. 8 to FIG. 10 are plan views showing examples of plane shapes of anti-slip piece 3. Anti-slip piece 3 shown in FIG. 8 supports only one side of semiconductor chip 4, and is effective when the probe pressure is concentrated on the one side. While the direction of probe pressure 8 is not necessarily concentrated in one direction, it is possible to adjust the direction of the probe pressure on the whole with dummy probing in which a proper position within a chip is subjected to probing with probe 6 to which no electrical connection is made. Such dummy probing is effective when a small number of probing requiring terminals exist and the probe pressure required for fixing semiconductor chip 4 is insufficient, including the case of reversed prober for analysis at the back side analysis.

However, probes available for the dummy probing for adjusting the direction of the probe pressure may not be ensured depending on the number of probing requiring terminals. In such a case, semiconductor chip 4 can be stably fixed by supporting two sides thereof as shown in FIG. 9 and FIG. 10. Anti-slip piece 3 shown in FIG. 9 supports semiconductor chip 4 with one corner centered, and is more effective in an arrangement such that the probe pressure is concentrated near the corner.

FIG. 10 shows an example in which semiconductor chip 4 is supported at two sides. In this case, since the respective sides are supported by separate anti-slip pieces 3, the angle formed by anti-slip pieces 3 can be adjusted in accordance with the cut shape of a semiconductor chip or the like even when the angle formed by the two sides is not a right angle, thereby allowing more stable fixing.

Figure 11:
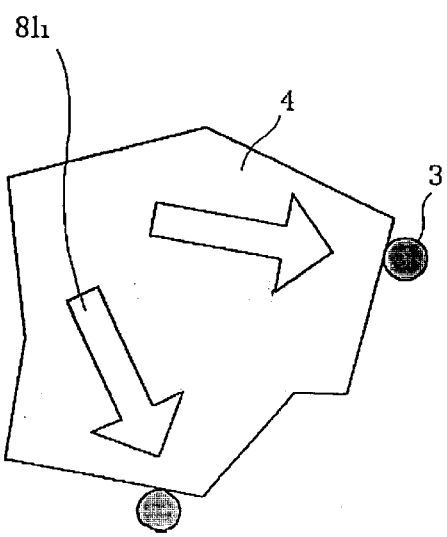
FIG. 11 is a plan view (4) for explaining how the semiconductor chip of the present invention is fixed.

In addition, FIG. 11 shows anti-slip pieces 3 which support semiconductor chip 4 at two points in its ends. Thus, semiconductor chip 4 is adjusted in orientation to achieve matching with probing pressure 8 to make it possible to stably fix chips of various shapes such as a broken wafer segment.

Second Embodiment

Figure 12:
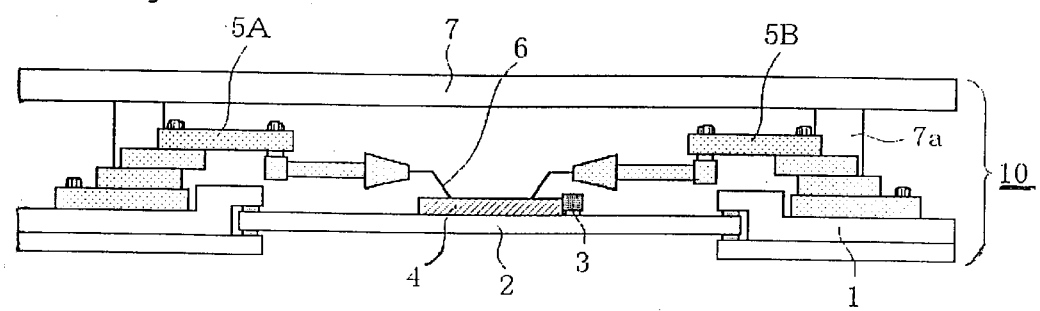
FIG. 12 is a vertical sectional view of a prober for analysis for explaining a second embodiment of the present invention.
Figure 13:
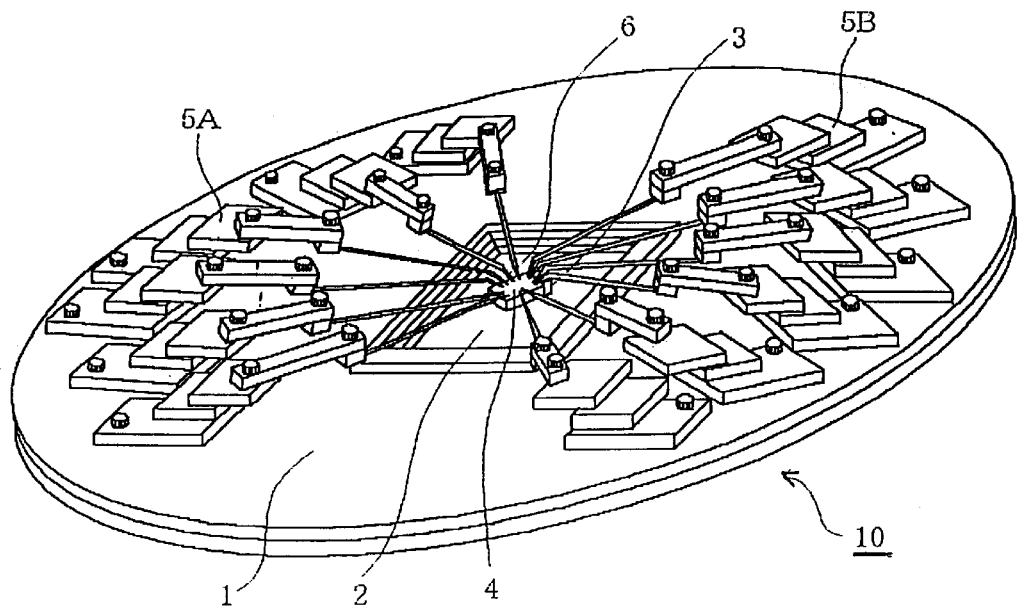
FIG. 13 is a perspective view of the prober shown in FIG. 12.

FIG. 12 is a vertical sectional view of a prober for analysis for explaining a second embodiment of the present invention, and FIG. 13 is a perspective view of the prober.

Probing with a manipulator generally has an advantage that it flexibly supports semiconductor chips of different dimension shapes and pad arrangements. However, the allowed number of probing operations is limited by the area of a board due to a large occupied area per manipulator on the board. In the first embodiment, as shown in FIG. 4 and FIG. 5, manipulator 5 is disposed only at a position opposite to anti-slip piece 3 with respect to semiconductor chip 4.

In contrast, a second embodiment as shown in FIG. 12 and FIG. 13 may be employed when the board has a sufficient area. The second embodiment is configured to dispose manipulator 5B on the side of anti-slip piece 3 in addition to manipulator 5A at a position opposite to anti-slip piece 3 with respect to semiconductor chip 4. The remaining structure is similar to that of the first embodiment. The detection of a defective point, analysis and the like are performed similarly to the first embodiment.

Therefore, the use of the apparatus of the second embodiment enables an increased number of probing operations.

Next, description is made for the relationship of the forces exerted on the semiconductor chip at probing. The force produced in the horizontal direction from the probe pressure with manipulator 5B disposed on the side of anti-slip piece 3 acts in a direction such that semiconductor chip 4 is released from anti-slip piece 3. However, unless the force becomes larger than the force in the horizontal direction produced from the probe pressure with manipulator 5A disposed on the opposite side to anti-slip piece 3, the pressure as a whole may be applied such that semiconductor chip 4 is pushed against anti-slip piece 3.

Specifically, after semiconductor chip 4 is brought into contact with board 1 at its bottom surface and with anti-slip piece 3 at its side surface, probing is performed with manipulator 5A disposed on the opposite side to anti-slip piece 3 to push and fix the bottom surface and side surface of semiconductor chip 4. Then, probing is performed with manipulator 5B disposed on the side of anti-slip piece 3, Thus, probing is allowed with no displacement from the position where semiconductor chip 4 is fixed.

At this point, even when the force in the horizontal direction produced from the probe pressure with manipulator 5B disposed on the side of anti-slip piece 3 becomes larger than the force in the horizontal direction produced from the probe pressure with manipulator 5A disposed on the opposite side to anti-slip piece 3 to result in a force exerted as a whole in a direction such that semiconductor chip 4 is released from anti-slip piece 3, the position of semiconductor chip 4 is not shifted unless the resultant force becomes larger than the friction acting between semiconductor chip 4 and quartz plate 2.

If the number of probing operations is increased as shown in FIG. 13, the force which pushes semiconductor chip 4 against quarts plate 2 is increased, and the repulsion acting on semiconductor chip 4 from quartz plate 2 is also increased. Thus, as long as the number of manipulators 5B disposed on the side of anti-slip piece 3 is approximately equal to or smaller than and the number of manipulators 5A disposed on the opposite side to anti-slip piece 3, the probing with the aforementioned procedure enables semiconductor chip 4 to be fixed while probing is performed.

In addition, dummy probing may be performed to adjust the direction of the probe pressure as a whole or to fix semiconductor chip 4, similarly to the first embodiment.

Third and Fourth Embodiments

Figure 14:
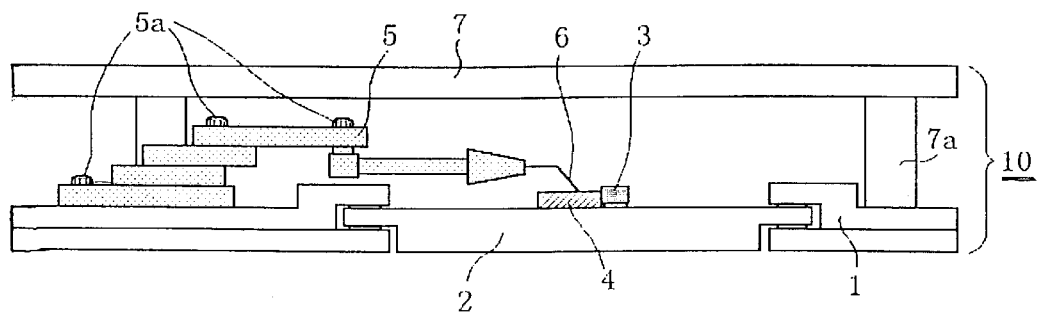
FIG. 14 is a vertical sectional view of a prober for analysis for explaining a third embodiment of the present invention.
Figure 15:
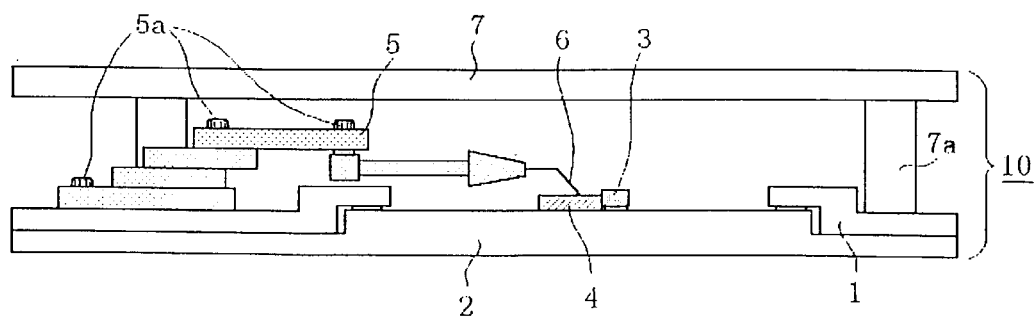
FIG. 15 is a vertical sectional view of a prober for analysis for explaining a fourth embodiment of the present invention.

FIG. 14 and FIG. 15 are vertical sectional views showing third and fourth embodiments of the present invention, respectively. In the first and second embodiments, when prober 10 for analysis is mounted on a wafer stage with board 1 facing downward, quartz plate 2 may be bent to be curved downward due to the vacuum absorption with the wafer stage. The third and fourth embodiments address this problem.

In the third embodiment shown in FIG. 14, quartz plate 2 is formed into a shape with a protrusion in a lower portion such that the bottom surface of quartz plate 2 matches the bottom surface of board 1. The remaining structure is not different from the first embodiment shown in FIG. 4.

In the fourth embodiment shown in FIG. 15, the outer shape of quartz plate 2 is the same as the outer shape of board 1 and quartz plate 2 is provided at the central portion with a protrusion on which semiconductor chip 4 is mounted. Quartz plate 2 is fixed to board 1 using an adhesive or the like. The remaining structure is not different from the first embodiment shown in FIG. 4.

The fourth embodiment may be changed such that quartz plate 2 is not provided with the protrusion and semiconductor chip 4 is mounted on such flat quartz plate 2.

While some preferred embodiments have been described, the present invention is not limited thereto and appropriate changes may be made within the scope set forth in the claims. For example, while the aforementioned embodiments provide description of the prober for analysis according to the present invention which is mounted on the wafer stage of the wafer analysis apparatus, such an analysis apparatus is not necessarily used, and a dedicated analysis apparatus may be provided and used. In this case, a stage on which the prober for analysis of the present invention is mounted is desirably movable relative to an optical device in the horizontal direction with favorable accuracy. When a dedicated analysis apparatus is provided, a stage on which the prober for analysis of the present invention is mounted may be provided with small holes for vacuum absorption only in the portion in contact with board 1.

As described above, according to the present invention, the following effects are achieved.

As a first effect, the analysis TAT can be reduced as compared with analysis of a semiconductor chip mounted on a package.

A first reason thereof is that probing is performed on a semiconductor chip cut from a semiconductor wafer to allow the prober for analysis to be reduced in size and weight, thereby facilitating handling of the prober such as carrying while probing is performed, turning it upside down or the like. In other words, in performing failure analysis, only probing can produce effects similar to those obtained by mounting in a package, which can reduce the time taken for mounting in a package.

A second reason is that the bottom surface of a semiconductor chip pushed against and fixed to the stage made of a material which can pass infrared light allows the back side analysis to be performed through the stage, resulting in the elimination of the opening of the mounted chip at the back.

As a second effect of the present invention, an increase in cost of analysis can be reduced while both front side analysis and back side analysis are allowed in performing analysis with probing.

A first reason thereof is that since probing is performed on a semiconductor chip cut from a semiconductor wafer and the pressure from the probing causes the semiconductor chip to be fixed, the need for a dedicated mechanism for vacuum absorption is eliminated to render the structure small and simple, thereby reducing the manufacturing cost.

A second reason is that since the present invention employs a mechanism in which the bottom surface of a semiconductor chip is pushed against and fixed to the stage made of a material which can pass infrared light and the removable plate is mounted, both front side analysis and back side analysis can be performed only by turning the prober upside down on a wafer stage for a typical wafer analysis apparatus, thus eliminating the need for an expensive analysis apparatus.

As a third effect of the present invention, restrictions on the dimensional shape of a chip can be relaxed as compared with the back side analysis performed by fixing a semiconductor chip with vacuum absorption.

A reason thereof is that since the bottom surface of the semiconductor chip is pushed against and fixed to the stage made of a material which can pass infrared light, the chip need not include a holding region in the perimeter for vacuum absorption to allow chips of more various shapes to be fixed.

It is to be understood, however, that although the characteristics and advantages of the present invention have been set forth in the foregoing description, the disclose is illustrative only, and changes may be made in the arrangement of the parts within the scope of the appended claims.

What is claimed is:

1. A prober for analyzing a semiconductor chip, comprising:
    a chip stage on which a semiconductor chip is mounted;
    a plurality of probes arranged to contact a surface of a semiconductor chip mounted on said chip stage; and
    an anti-slip piece on said chip stage for supporting at least one side of a semiconductor chip;
    wherein at least part of said chip stage in contact with a semiconductor chip is composed of a plate of infrared ray transmitting material, and
    wherein said plurality of probes are arranged and adapted to push a semiconductor chip onto said chip stage with pressure to fix the semiconductor chip on said chip stage.

2. The prober for analyzing a semiconductor chip according to claim 1, wherein said probe is movable vertically and horizontally with a manipulator supported on said chip stage.

3. The prober for analyzing a semiconductor chip according to claim 1, wherein said plate of infrared ray transmitting material is quartz glass.

4. The prober for analyzing a semiconductor chip according to claim 1, wherein said plurality of probes include a dummy probe which makes no electrical connection to said semiconductor chip, and also performs probing.

5. The prober for analyzing a semiconductor chip according to claim 2, further comprising a board which holds said plate of infrared ray transmitting material and supports said manipulator.

6. The prober for analyzing a semiconductor chip according to claim 5, wherein said plate of infrared ray transmitting material has a bottom surface generally matching a bottom surface of said board.

7. The prober for analyzing a semiconductor chip according to claim 5, wherein said plate of infrared ray transmitting material is held air-tight to said board.

8. A prober for analyzing a semiconductor chip, comprising:
    a chip stage on which a semiconductor chip is mounted;
    a plurality of probes arranged to contact a surface of a semiconductor chip mounted on said chip stage; and
    a removable covering plate to cover said chip stage,
    wherein at least part of said chip stage in contact with a semiconductor chip is composed of a plate of infrared ray transmitting material, and
    wherein said plurality of probes are arranged and adapted to push a semiconductor chip onto said chip stage with pressure to fix the semiconductor chip on said chip stage.

9. The prober for analyzing a semiconductor chip according to claim 8, wherein a post for fixing said covering plate is provided on said chip stage.

10. A prober for analyzing a semiconductor chip, comprising:
    a plate of a material that is transparent to infrared rays and that is adapted to receive a semiconductor chip thereon;
    plural movable probes that are each adapted to contact a semiconductor chip on said plate, said plural probes being arranged and adapted to resist movement of the semiconductor chip away from said plate and to hold the semiconductor chip on said plate regardless of an orientation of said plate; and
    a projection affixed to said plate and that is arranged and adapted to resist lateral movement of the semiconductor chip across said plate.

11. The prober of claim 10, wherein first ones of said plural probes are arranged and adapted to apply an electrical input to the semiconductor chip on said plate and second ones of said plural probes are dummy probes that are not adapted to apply an electrical input to the semiconductor chip.

12. A prober for analyzing a semiconductor chip, comprising:

a plate of a material that is transparent to infrared rays and that is adapted to receive a semiconductor chip thereon;

plural movable probes that are each adapted to contact a semiconductor chip on said plate, said plural probes being arranged and adapted to resist movement of the semiconductor chip away from said plate and to hold the semiconductor chip on said plate regardless of an orientation of said plate;

a board having an opening in which said plate is mounted; and a cover that is removably attached to said board and that is spaced from said plate and covers said plural probes and a surface of said plate on which a semiconductor chip is received, said board and said cover each being arranged and adapted to be received on a wafer stage for analyzing a semiconductor chip.

13. The prober of claim 12, further comprising manipulators mounted on said board for manipulating said plural probes.

14. The prober of claim 12, wherein a surface of said plate that is opposite a surface on which a semiconductor chip is received is flush with a corresponding surface of said board.

15. The prober of claim 12, wherein a surface of said plate that is opposite a surface on which a semiconductor chip is received underlies an entirety of said board.

16. A prober for analyzing a semiconductor chip, comprising:

a base having an opening therein;

a plate of a material that is transparent to infrared rays and that is mounted in said opening and adapted to receive a semiconductor chip thereon;

a projection affixed to said plate and that is arranged and adapted to resist lateral movement of a semiconductor chip across said plate;

plural movable probes that are each adapted to contact a semiconductor chip on said plate, said plural probes being arranged and adapted to resist movement of the semiconductor chip away from said plate and to hold the semiconductor chip on said plate regardless of an orientation of the prober;

manipulators mounted on said board for moving said plural probes relative to a semiconductor chip on said plate; and a cover that is removably attached to said board and that is spaced from said plate and covers said plural probes and a surface of said plate on which a semiconductor chip is received, said base and said cover each being arranged and adapted to be received on a wafer stage for analyzing a semiconductor chip.

* * * * *